US00RE49668E

(19) United States
(12) Reissued Patent
Gombert et al.

(10) Patent Number: US RE49,668 E
(45) Date of Reissued Patent: Sep. 26, 2023

(54) CONCENTRATOR FRESNEL LENS WITH VARYING DRAFT ANGLE

(71) Applicant: Saint-Augustin Canada Electric Inc., Saint-Augustin de Desmaures (CA)

(72) Inventors: Andreas Gombert, Freiburg (DE); Martin Neubauer, Freiburg (DE)

(73) Assignee: Saint-Augustin Canada Electric Inc., Saint-Augustin de Desmaures (CA)

(21) Appl. No.: 17/088,176

(22) Filed: Nov. 9, 2020

Related U.S. Patent Documents

Reissue of:
(64) Patent No.: 10,139,527
Issued: Nov. 27, 2018
Appl. No.: 14/426,008
PCT Filed: Sep. 10, 2013
PCT No.: PCT/EP2013/068703
§ 371 (c)(1),
(2) Date: Mar. 4, 2015
PCT Pub. No.: WO2014/037580
PCT Pub. Date: Mar. 13, 2014

(30) Foreign Application Priority Data

Sep. 10, 2012 (FR) ..... 1258451

(51) Int. Cl.
*G02B 3/08* (2006.01)
*H01L 31/054* (2014.01)
*G02B 19/00* (2006.01)

(52) U.S. Cl.
CPC ..... *G02B 3/08* (2013.01); *G02B 19/00* (2013.01); *G02B 19/0009* (2013.01); *H01L 31/0543* (2014.12); *Y02E 10/52* (2013.01)

(58) Field of Classification Search
CPC ..... G02B 19/00; G02B 3/08; G02B 19/0009; H01L 31/0543; Y02E 10/52
See application file for complete search history.

(56) References Cited

U.S. PATENT DOCUMENTS 4,824,227 A * 4/1989 Goldenberg ..... G03B 21/625 359/742
4,904,069 A * 2/1990 Nakata ..... C03B 11/082 359/710

(Continued)

FOREIGN PATENT DOCUMENTS

CN 102230980 A 11/2011
JP 2007-264415 A 10/2007

(Continued)

OTHER PUBLICATIONS

France Search Report for France Application No. 1258451 dated May 29, 2013, 8 pages.

(Continued)

*Primary Examiner* — Christina Y. Leung
(74) *Attorney, Agent, or Firm* — TraskBritt

(57) ABSTRACT

The present invention relates to a Fresnel lens and a respective mold, the lens comprising a plurality of draft facets, wherein the draft angle of the draft facets has at least two different angular values for two different draft facets, in particular, wherein the draft angle is bigger for a draft facet closer to the edge of the lens or, respectively, of the mold, than for a draft facet closer to the center of the lens or, respectively, of the mold.

30 Claims, 4 Drawing Sheets

(56) References Cited

U.S. PATENT DOCUMENTS

| | | | | |
|---|---|---|---|---|
| 5,940,152 | A * | 8/1999 | Wilson | H04N 5/7441 349/57 |
| 6,399,874 | B1 * | 6/2002 | Olah | F24J 2/085 136/246 |
| 6,452,731 | B1 * | 9/2002 | Schorning | B60R 1/001 359/619 |
| 2006/0245055 | A1 * | 11/2006 | Peterson | G02B 3/08 359/457 |
| 2009/0250095 | A1 | 10/2009 | Thorley et al. | |
| 2010/0150200 | A1 | 6/2010 | Ho et al. | |
| 2010/0165489 | A1 * | 7/2010 | Tobita | G02B 3/08 359/742 |
| 2010/0177406 | A1 | 7/2010 | Walker | |

FOREIGN PATENT DOCUMENTS

| | | | | |
|---|---|---|---|---|
| JP | 2009-257732 | A | 11/2009 | |
| JP | 2009257732 | A * | 11/2009 | F24S 23/31 |

OTHER PUBLICATIONS

International Search Report for International Application No. PCT/EP2013/068703 dated Dec. 2, 2013, 4 pages.

International Preliminary Report on Patentability for International Application No. PCT/EP2013/068703 dated Mar. 10, 2015, 5 pages.

Written Opinion for International Application No. PCT/EP2013/068703 dated Dec. 2, 2013, 18 pages.

Chinese First Office Action for Chinese Application No. 201380046771.8 dated Jan. 15, 2016, 8 pages.

Chinese Second Office Action for Chinese Application No. 201380046771.8 dated Aug. 19, 2016, 8 pages.

Chinese Third Office Action for Chinese Application No. 201380046771.8 dated Mar. 2, 2017, 5 pages.

* cited by examiner

CONCENTRATOR FRESNEL LENS WITH VARYING DRAFT ANGLE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*Notice: This is a reissue application of U.S. Pat. No. 10,139,527 B2, issued Nov. 27, 2018, to Gombert et al. for CONCENTRATOR FRESNEL LENS WITH VARYING DRAFT ANGLE.*

CROSS-REFERENCE TO RELATED APPLICATIONS

This application is a national phase entry under 35 U.S.C. § 371 of International Patent Application PCT/EP2013/068703, filed Sep. 10, 2013, designating the United States of America and published in English as International Patent Publication WO 2014/037580 A1 on Mar. 13, 2014, which claims the benefit under Article 8 of the Patent Cooperation Treaty and under 35 U.S.C. § 119(e) to France Patent Application Serial No. 1258451, filed Sep. 10, 2012, the disclosure of each of which is hereby incorporated herein in its entirety by this reference.

TECHNICAL FIELD

The present invention relates to the field of lenses. In particular, it relates to the field of lenses for concentrated photovoltaic generators. More specifically, it relates to a Fresnel lens and a respective mold, the lens comprising a plurality of draft facets wherein each draft facet has a draft angle.

BACKGROUND

In recent years due to the constant increase of energy prices dictated, in particular, by the constant increase in the price of fossil fuels, more and more interest has been shown towards renewable energy sources. One particularly appreciated form of renewable energy source consists in sunlight converted into electricity by means of photovoltaic generators.

The advantage of a photovoltaic generator over other renewable energy sources such as wind, waves and biomasses includes the fact that it does not require moving pieces, thereby, lowering costs and maintenance, and that can be installed virtually anywhere in sizes ranging from a few square centimeters to photovoltaic parks, covering several square kilometers.

One particularly advantageous form of photovoltaic generators consists of concentrated photovoltaic generators. Even more specifically, concentrated photovoltaic generators are preferred since they reduce material costs compared to the non-concentrated photovoltaic generators. In particular, the sunlight is concentrated via at least one lens onto a cell. In this manner, the size of the cell can be reduced, thereby, lowering the costs associated with semiconductor materials and processes necessary for realizing the cell.

Usually, in concentrated photovoltaic generators, Fresnel lenses are used. The advantage of Fresnel lenses over a standard lens consists in the fact that they can achieve the same value of sunlight concentration with a thinner surface, thereby, lowering space requirements and cost of materials for the lenses. In most of the cases, the Fresnel lenses are square, or rectangular, and arranged as a lens plate with several lenses next to each other. For instance, FIG. 4 schematically illustrates a top view of two lenses 4100 and 4200 realizing a lens plate 4000. In particular, in lens 4200, a plurality of circular lines illustrates facets of the Fresnel lens. In lens 4100, only some of those facets have been represented for ease of illustration. More specifically, the smallest illustrated facet in lens 4100 corresponds to a radius R41. A bigger facet corresponding to radius R42 is further illustrated together with a facet corresponding to an even bigger radius R43. As can be seen, only facets having a radius which is smaller than or equal to half of the width 4001 of the lens 4100 achieve a complete circumference. This is, for instance, the case for facets having radius R41 and R42. For facets such as the one having radius R43, only parts of the circumference fit within the lens 4100. The last circumference fitting in the lens 4100 is ideally the one corresponding to radius R44 having the biggest value fitting in the lens 4100.

FIG. 1 schematically illustrates a cut view of a single Fresnel lens 1000, taken along the diameter of the lens.

In particular, Fresnel lens 1000 is realized on a substrate 1001, such as glass or plastic, having a plurality of lens sections 1100-1600. Even more specifically, each of the lens sections 1100-1600 comprises a slope facet and a draft facet. For instance, in relation to lens sections 1500, slope facet 1540 and draft facet 1550 are indicated. The slope and draft facets are defined by their angles and lengths. More specifically, the slope facet 1540 of each of the lens sections 1100-1600 has a slope angle 1341 indicated, with reference to respective slope facet 1540 of lens sections 1300. Similarly, the draft facet 1550 of each of the lens sections 1100-1600 has a draft angle 1151 indicated with reference to respective draft facet 1550 of lens section 1100.

The slope facet 1540 is the facet providing the optical function. On the other hand, the draft facet 1550 is used in order to achieve a flat shape for the Fresnel lens 1000, but provides no optical functionality. It is, therefore, generally an object of a Fresnel lens to have a draft angle 1151 as small as possible, in order to reduce the surface of the Fresnel lens not achieving any optical functionality, so as to maximize the efficiency of the lens.

However, reduction of the draft angle 1151 is only possible to a certain degree. This is due in particular to the fabrication method of replicated Fresnel lenses. As machined Fresnel lenses are much too expensive, the much less expensive method of replicating Fresnel lenses is employed. Usually, a first master structure used to realize Fresnel lenses is first manufactured on a diamond turning into a metal substrate. This first master structure is then replicated into nickel by using electroforming. From the first nickel replica, further nickel molds are made in order to build up a complete production tooling which is then used in high volume production of replicated lenses, or lens plates. A critical process step in this fabrication method is the separation of a pair of nickel molds. In this step, the draft angle 1151 plays a critical role because the smaller the angle, the larger the forces which will be required to separate the two nickel molds. This usually implies that the angle cannot be reduced to zero, but an optimum minimum angle has to be found between the optical efficiency of the Fresnel lens and the manufacturability of the lens itself via the process described above.

BRIEF SUMMARY

It is, therefore, an object of the present invention to provide a Fresnel lens and the respective mold, which achieves high efficiency while still providing a high level of manufacturability.

The present invention can relate to a mold for a Fresnel lens wherein the draft angle of the draft facets of the mold has at least two different angular values for two different draft facets. The invention can also relate to Fresnel lens comprising a plurality of draft facets wherein the draft angle of the draft facets has at least two different angular values for two different draft facets.

The invention can also relate to a manufacturing method of a Fresnel lens or of a mold for a Fresnel lens including the step of realizing the draft facets of the lens or, respectively, the mold with at least two different angular values for two different draft facets.

This provides the beneficial advantage that a different angle can be used for different facets, thereby, making a mold/mold separation and a lens/mold separation easier.

In some embodiments, the at least two different values can comprise a first value for the draft angle of the draft facet of a first mold or lens section and another value for the draft angle of the draft facet of a second mold or lens section, wherein the mold or lens section closer to the center of the mold or of the lens can have a smaller value for the draft angle.

This provides the beneficial advantage that mold/mold separation and a lens/mold separation is rendered easier on the second mold or lens section by the larger draft angle.

In some embodiments, the draft angle of the draft facets of a first region of the mold or the lens can be smaller than the draft angle of the draft facets of a second region of the mold or the lens.

This provides the beneficial advantage that mold/mold separation and a lens/mold separation is rendered easier on the second mold or lens region by the larger draft angle.

In some embodiments, the draft angle can increase with an increasing radius of the draft facets. This provides the beneficial advantage that mold/mold separation and a lens/mold separation is stepwisely rendered easier, with increasing radius, thereby, facilitating more the separation on the draft facets, which are increasingly more difficult to separate, so as to achieve a constant separation force over the entire surface of the lens.

BRIEF DESCRIPTION OF THE DRAWINGS

The invention will now be described in more detail by way of example hereinafter, using advantageous embodiments and with reference to the drawings. The described embodiments are only possible configurations in which the individual features may, however, as described above, be implemented independently of each other, or may be omitted, or may be combined between different embodiments. Equal elements illustrated in the drawings are provided with equal reference signs. Parts of the description relating to equal elements illustrated in the different drawings may be left out. In the drawings.

DETAILED DESCRIPTION

Figure 1:
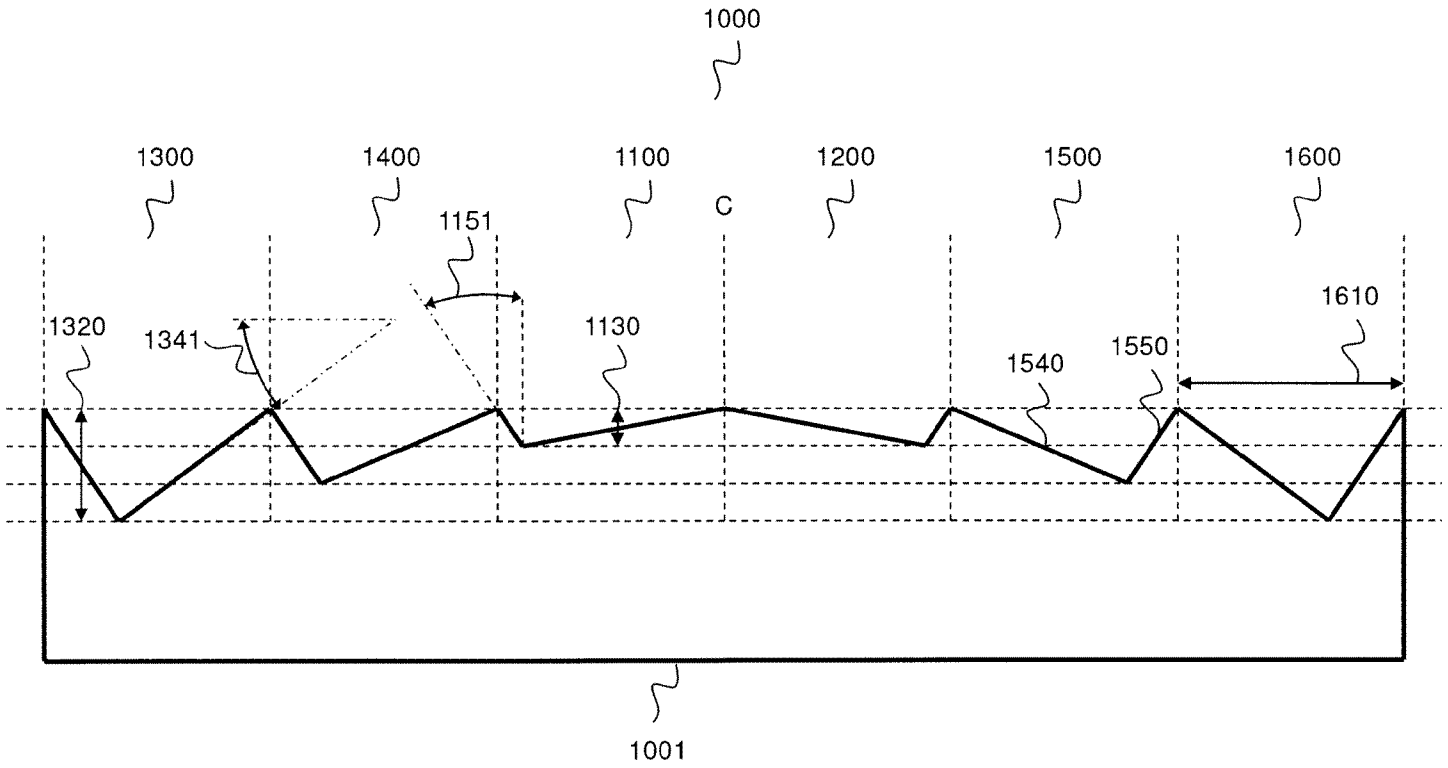
FIG. 1 schematically illustrates a constant pitch Fresnel lens 1000.

Fresnel lens 1000 illustrated in FIG. 1 is a constant pitch Fresnel lens. In particular, the horizontal dimension 1610, indicated in relation to lens section 1600, is the same for each of lens sections 1100-1600. Due to the geometry of the lens needed for focusing light, slope angle 1341 increases when moving from the center C of the lens 1000, toward the periphery of the lens 1000. In a constant pitch Fresnel lens, such as lens 1000 illustrated in FIG. 1, the height of each of the lens sections 1100-1600 will then increase when moving away from center C. In particular, height 1130, illustrated with respect to lens section 1100 adjacent to the center C of the lens 1000 is smaller than height 1320 illustrated with reference to lens section 1300 further away from the center C of the lens 1000.

This increase in height results in the fact that nickel molds, realized with the manufacturing process described above, are more difficult to separate in those regions of the lens further away from the center C. In particular, as can be seen in FIG. 1, the respective draft facet 1550 of lens section 1300 has a bigger dimension than the respective draft facet 1550 of lens section 1100. The increasing height of the larger draft facet results in a more difficult separation between the molds in the region of lens sections 1300 and 1600 than in the region of lens sections 1100 and 1200, closer to the center C of the lens. In particular, for small draft angles, the draft facet 1550 has a quasi-vertical surface. While separation of such a quasi-vertical surface may not be problematic for draft facet 1550 of lens section 1100, it becomes increasingly harder for draft facet 1550 of lens section 1300.

Figure 2:
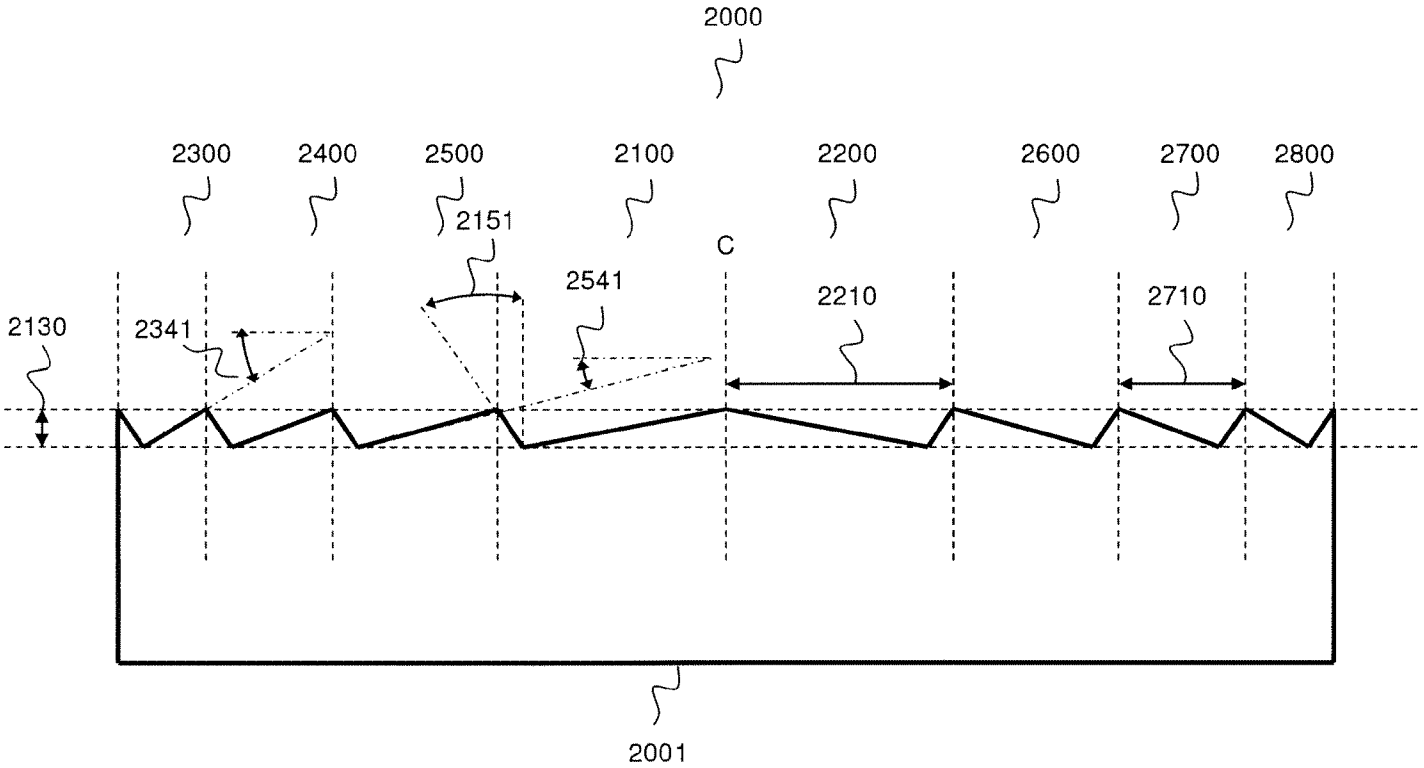
FIG. 2 schematically illustrates a constant height Fresnel lens 2000.

A possible way of reducing the dimensions of the draft surface of lens sections away from the center C is illustrated by the Fresnel lens 2000 of FIG. 2.

More specifically, FIG. 2 schematically illustrates a constant height Fresnel 2000. In contrast to the lens 1000 of FIG. 1, Fresnel lens 2000 comprises a plurality of lens sections 2100-2800 each of which the same height 2130. Due to the optical functionality of the Fresnel lens, as described above, the slope angle increases for lens sections away from the center C of the lens, such as illustrated by slope angle 2341 of lens section 2300 being larger than the slope angle 2541 of lens section 2500. This results in the horizontal dimension of the lens sections 2100-2800 becoming smaller and smaller when moving them away from the center C, as illustrated by horizontal dimension 2210 of lens section 2200 being larger than horizontal dimension 2710 of lens section 2700.

However, the reduction in horizontal dimensions when moving away from the center C has the effect that the percentage of surface of the lens which is occupied by the draft facets increases, when moving towards the exterior of the lens. In particular, since the draft angle 2151 does not change along the surface of the lens 2000, while the slope angle 2341, 2541 increases when moving away from the center C, the ratio between the horizontal surface of the lens 2000 taken by draft facets on the horizontal surface of the lens 2000 taken by slope facets increases, as can be seen in FIG. 2. So, since there is, on percentage, more draft surface closer to the edges of the lens than on the center of the lens, also for lens 2000, as for lens 1000, the separation of the molds will be more difficult on the side of the lens than on the center, and this especially for small draft angles.

Figure 3:
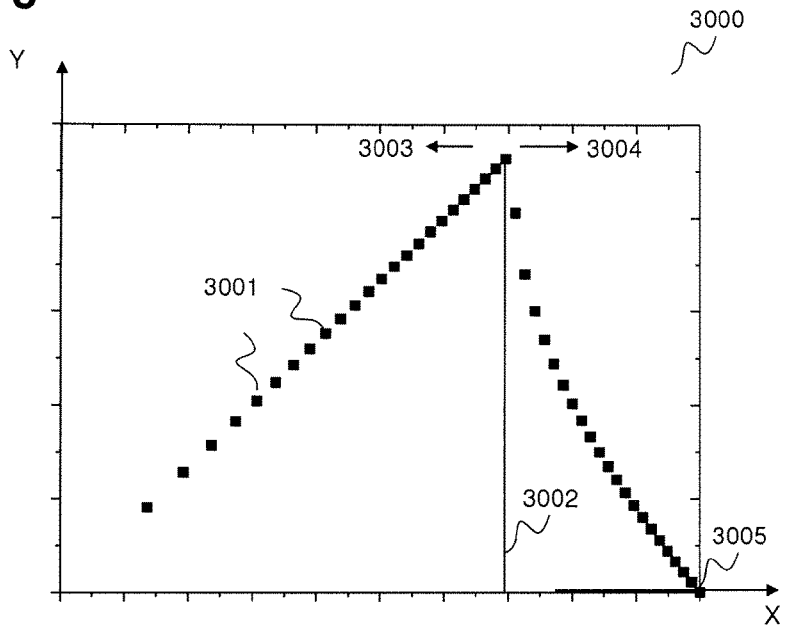
FIG. 3 schematically illustrates the relationship between the draft facet area and the radius of a Fresnel lens with a geometry different to circular shape.

FIG. 3 schematically illustrates the relationship between the horizontal dimension of the draft facets, on the Y axis, and the radius of the lens, on the X axis, of a Fresnel lens 1000 or 2000.

Figure 4:
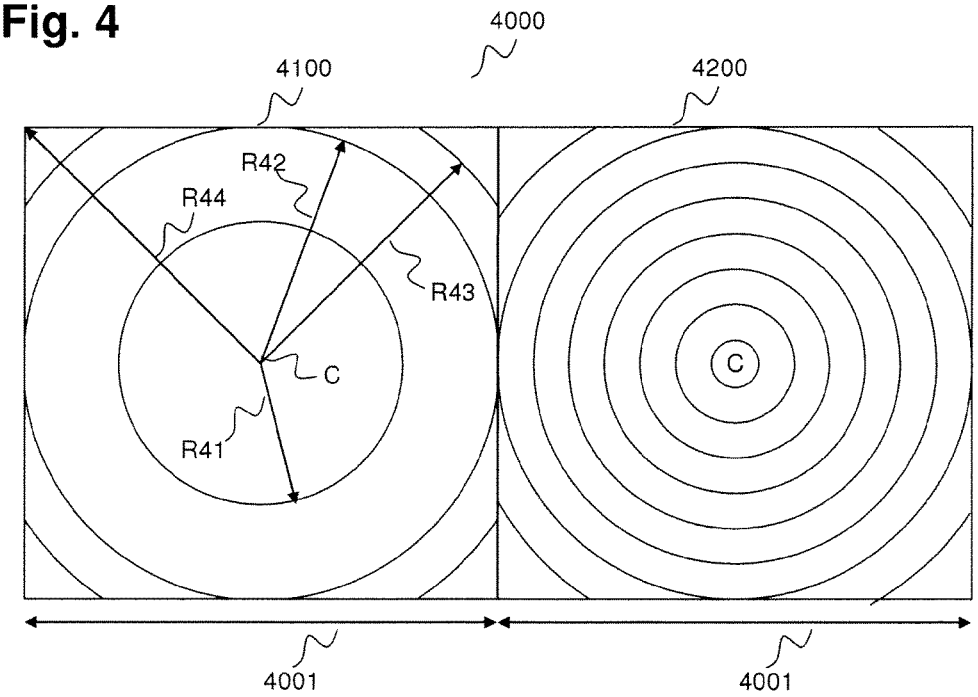
FIG. 4 schematically illustrates a lens plate 4000 comprising two square Fresnel lenses.

Line 3002 on the X axis represents the value of the radius corresponding to the last full circumference of the lens which has a geometry different than a circular shape, in particular, a square shape or a hexagonal shape, but is not limited thereto. The square shape Fresnel lens is shown in FIG. 4, in which Line 3002 corresponds to radius R42. As can be seen, in the region 3003, where the radius has values below line 3002, corresponding to the circular shaped part of the Fresnel lens, there is a substantially increasing correlation between the area occupied by the draft facet and the radius of the corresponding facet such as indicated by points 3001. On the other hand, in the region 3004 in which the value of the radius is above line 3002, corresponding, for instance, to radius R43 of FIG. 4, there is a substantially decreasing relationship between the value of the radius and the area of the lens occupied by the draft facet. This can be explained by noting that although radius R43 is bigger than radius R41, which would result in a bigger area, the area of the draft facet corresponding to radius R43 can be smaller than the area of the draft facet corresponding to radius R41 since the draft facet of radius R43 does not extend for the entire circumference but only for a portion of it, as illustrated in FIG. 4. At the limit, the circumference corresponding to radius R44, although being the biggest circumference contained by lens 4100, will have the lowest amount of draft area, as illustrated by point 3005, since only the four ideal points at the corners of the lens 4100 are included in the circumference having the radius R44.

The present invention exploits this relationship into providing a Fresnel lens with high efficiency and a high level of manufacturability. In particular, in the present invention, the draft angle 1151, 2151 is not constant along the entire surface of the lens, for each of the lens section 1100-1600 or 2100-2800, but has at least two values. More specifically, in an embodiment of the invention, the draft angle increases from a first value to at least a second value, when moving away from the center C of the Fresnel lens and toward the periphery of the lens.

Figure 5:
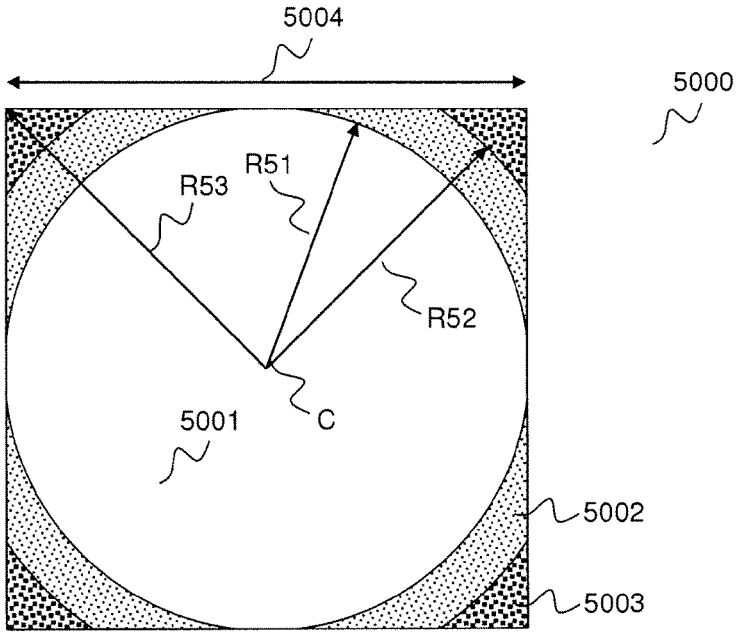
FIG. 5 schematically illustrates a square Fresnel lens in accordance with an embodiment of the present invention.

FIG. 5 schematically illustrates a top view of a Fresnel lens 5000 in accordance with an embodiment of the present invention. Facets have not been illustrated, for ease of representation. As can be seen in FIG. 5, Fresnel lens 5000 has a lateral dimension 5004. As for the Fresnel lens of FIG. 4, facets will have a complete circumference only to a certain radius, corresponding to radius R51. Facets having a radius above this value, such as radius R52 and R53 will only include a part of the circumference within the square shape of the lens 5000. In this embodiment, facets included in the region of the lens 5000 having a radius smaller than radius R51, that is, region 5001, have a first value for the draft angle, for instance, 2°. This provides a high efficiency of the lens, since the area occupied by the draft facets is reduced thanks to the rather small value of draft angle. Moving further toward the edge, in region 5002 in which facets have a radius comprised between radius R51 and radius R52, the draft angle is increased, for instance, to a value of 3°, thereby, providing an easier manufacturability of the cell, since the angle is increased on the exterior part of the lens, where separation of the nickel plates is usually more difficult. Still further, for facets having a radius bigger than radius R52 up to a value of radius R53, corresponding to region 5003, the draft angle is further increased, for instance, to a value of 5°, further simplifying the manufacturability of the lens in its most critical region during the separation of the nickel molds. The increase of the draft angle on the other hand has a contained impact on the efficiency of the lens, since the draft area of the facets above radius R52 is rather low, as illustrated by FIG. 3.

While the embodiment above has been described with three values for the draft angle, the present invention is not limited thereto. In particular, any number of values for the draft angle could be employed from as low as two values to a consecutively changing value for each of the facets. In particular, the present invention can be carried out by providing even just a single facet in the periphery of the lens, which has a draft angle bigger than a facet closer to the center of the lens. As further exemplary embodiments, regions 5002 and 5003 could have the same draft angle, bigger than the draft angle of region 5001. Alternatively, region 5002 and 5001 could have the same draft angle, smaller than the draft angle of region 5003. Still alternatively, the draft angle could increase stepwise, for each facet starting from facet corresponding to radius R51, or even starting from facets of the center of the Fresnel lens.

It will be clear to those skilled in the art that while the above description has been made with respect to a lens, the same concept can also be applied to the mold, forming the lens. It is, therefore, possible to apply what is described above to a mold for a Fresnel lens, which is also, therefore, an embodiment of the invention.

Although reference has been made to a specific manufacturing method involving diamond machining and subsequent electroforming of nickel molds, the present invention is not limited, thereto, and can be carried out independently of the material of the molds and independently on whether they are electroformed, casted, etc. As long as a lens has to be separated from another lens, or separated from a mold, or as long as a mold has to be separated from another mold, the present invention can be carried out, to make the separation step easier, while still providing an efficient lens.

Additionally, the present invention can be carried out both on a fixed pitch lens, such as lens 1000, and on a fixed height lens, such as lens 2000 and to any combination thereof. For instance, a lens could be fixed-pitch until a certain radius and fixed-height from that radio onwards.

The invention claimed is:

1. A mold for a Fresnel lens comprising a mold plate having a surface including a plurality of alternating sloped facets and draft facets arranged concentrically about a center location, each slope facet oriented at a respective slope angle with respect to a plane parallel to the mold plate, each draft facet oriented at a respective draft angle relative to a line perpendicular to the mold plate, the draft angles of the draft facets of the mold having at least two different values for two different draft facets, wherein the draft facets of a first region of the mold have a first common draft angle common to all of the draft facets of the first region, the draft facets of a second region of the mold have a second common draft angle common to all of the draft facets of the second region, and the draft facets of a third region of the mold have a third common draft angle common to all of the draft facets of the third region, the first common draft angle being smaller than the second common draft angle, and the third common draft angle being larger than the second common draft angle, and further wherein at least two draft facets of the first region are at different radial distances from the center location, at least two draft facets of the second region are at different radial distances from the center location, [and]

wherein the first region is a center region extending from the center location to a first radius corresponding to [the] *a* last facet having a complete circumference, the second *region* extends from the first radius to a second radius greater than the first radius, and the third region extends from the second radius to a third radius greater than the second radius, *and wherein the first common draft angle is constant within the first region, the second common draft angles is constant within the second region, and the third common draft angle is constant within the third region*.

2. The mold according to claim 1, wherein the mold plate is non-circular.

3. A Fresnel lens comprising a substrate having a surface including a plurality of alternating sloped facets and draft facets arranged concentrically about a center location, each slope facet oriented at a respective slope angle with respect to a plane parallel to the substrate, each draft facet oriented at a respective draft angle relative to a line perpendicular to the substrate, the draft angles of the draft facets having at least two different values for two different draft facets, wherein the draft facets of a first region of the Fresnel lens have a first common draft angle common to all of the draft facets of the first region, the draft facets of a second region of the Fresnel lens have a second common draft angle common to all of the draft facets of the second region, and the draft facets of a third region of the Fresnel lens have a third common draft angle common to all of the draft facets of the third region, the first common draft angle being smaller than the second common draft angle, and the third common draft angle being larger than the second common draft angle, and further wherein at least two draft facets of the first region are at different radial distances from the center location, at least two draft facets of the second region are at different radial distances from the center location, [and]

wherein the first region is a center region extending from the center location to a first radius corresponding to [the] *a* last facet having a complete circumference, the second region extends from the first radius to a second radius greater than the first radius, and the third region extends from the second radius to a third radius greater than the second radius, *and wherein the first common draft angle is constant within the first region, the second common draft angle is constant within the second region, and the third common draft angle is constant within the third region*.

4. The lens according to claim 3, wherein the Fresnel lens is a fixed height lens or a fixed pitch lens.

5. The lens according to claim 3, wherein the substrate is non-circular.

6. A method of manufacturing a Fresnel lens or a mold for a Fresnel lens, comprising forming a substrate or a mold plate having a surface including a plurality of alternating sloped facets and draft facets arranged concentrically about a center location, each slope facet oriented at a respective slope angle with respect to a plane parallel to the substrate or *the* mold plate, each draft facet oriented at a respective draft angle relative to a line perpendicular to the substrate or *the* mold plate, the draft angles of the draft facets having at least two different values for two different draft facets, wherein the draft facets of a first region of the lens or *the* mold have a first common draft angle common to all of the draft facets of the first region, the draft facets of a second region of the *lens or the* mold have a second common draft angle common to all of the draft facets of the second region, and the draft facets of a third region of the *lens or the* mold have a third common draft angle common to all of the draft facets of the third region, the first common draft angle being smaller than the second common draft angle, and the third common draft angle being larger than the second common draft angle, and further wherein at least two draft facets of the first region are at different radial distances from the center location, at least two draft facets of the second region are at different radial distances from the center location, and wherein the first region is a center region extending from the center location to a first radius corresponding to the last facet having a complete circumference, the second region extends from the first radius to a second radius greater than the first radius, and the third region extends from the second radius to a third radius greater than the second radius, *and wherein the first common draft angles are constant within the first region, the second common draft angles are constant within the second region, and the third common draft angles are constant within the third region*.

7. The method of claim 6, further comprising:

forming the substrate or *the* mold plate to have a non-circular shape.

8. The mold according to claim 2, wherein the mold plate is square or rectangular.

9. The mold according to claim 2, wherein the common draft angle of the draft facets of the first region is 3.5°±1.5°.

10. The lens according to claim 5, wherein the substrate is square or rectangular.

11. The lens according to claim 3, wherein the common draft angle of the draft facets of the first region is 3.5°±1.5°.

12. A lens plate comprising a substrate including a plurality of Fresnel lenses arranged next to one another and each configured to focus sunlight impinging on [the] *a* Fresnel lens onto a region smaller than the Fresnel lens, each Fresnel lens of the plurality of Fresnel lenses comprising a portion of the substrate and including a surface in a region of the substrate having a plurality of alternating sloped facets and draft facets arranged concentrically about a center location, each slope facet oriented at a respective slope angle with respect to a plane parallel to the substrate, each draft facet oriented at a respective draft angle relative to a line perpendicular to the substrate, the draft angles of the draft facets having at least two different values for two different draft facets, wherein the draft facets of a first region of the [mold] *Fresnel lens* have a first common draft angle or angles common to all of the draft facets of the first region, the draft facets of a second region of the [mold] *Fresnel lens* have a second common draft angle or angles common to all of the draft facets of the second region, and the draft facets of a third region of the [mold] *Fresnel lens* have a third common draft angle or angles common to all of the draft facets of the second region, the first common draft angle or angles being smaller than the second *common* draft angle or angles and the third common draft angle or angles being larger than the second common draft angle or angles, and further wherein at least two draft facets of the first region are at different radial distances from the center location, at least two draft facets of the second region are at different radial distances from the center location, [and]

wherein the first region is a center region extending from the center location to a first radius corresponding to [the] *a* last facet having a complete circumference [h] *and* the second region extends from the first radius to a second radius greater than the first radius, and the third region extends from the second radius to a third radius greater than the second radius*, and wherein the first common draft angles are constant within the first region, the second common draft angle or angles are constant within the second region, and the third common draft angle or angles are constant within the third region.*

13. The lens plate of claim 12, wherein each of the Fresnel lenses is square or rectangular.

*14. A Fresnel lens, comprising:*

*a series of alternating slope facets and draft facets positioned in concentric circles within a periphery of a noncircular substrate;*

*wherein the draft facets of a first region of the Fresnel lens have a first common draft angle common to all of the draft facets of the first region, the draft facets of a second region of the Fresnel lens have a second common draft angle common to all of the draft facets of the second region, and the draft facets of a third region of the Fresnel lens have a third common draft angle common to all of the draft facets of the third region, wherein the first common draft angles are constant within the first region, the second common draft angle is constant within the second region, and the third common draft angle is constant within the third region, and wherein the first common draft angle is smaller than the second common draft angle, and the third common draft angle is larger than the second common draft angle;*

*wherein a draft angle of each draft facet comprising a complete circumference within the periphery of the noncircular substrate is equal to each draft angle of each draft facet comprising a complete circumference within the periphery of the noncircular substrate; and*

*wherein another draft angle of each other draft facet comprising an incomplete circumference within the periphery of the noncircular substrate is different from each draft angle of each draft facet comprising a complete circumference within the periphery of the noncircular substrate.*

*15. The Fresnel lens of claim 14, wherein each other draft angle of each other draft facet comprising an incomplete circumference within the periphery of the noncircular substrate is greater than each draft angle of each draft facet comprising a complete circumference within the periphery of the noncircular substrate.*

*16. The Fresnel lens of claim 14, wherein each other draft angle of each other draft facet comprising an incomplete circumference within the periphery of the noncircular substrate increases with increasing distance from a geometric center of the Fresnel lens.*

*17. The Fresnel lens of claim 14, wherein each other draft angle of each other draft facet comprising an incomplete circumference in a fourth region proximate to a geometric center of the substrate is different from each other draft angle of each other draft facet comprising an incomplete circumference in a fifth region distal from a geometric center of the noncircular substrate.*

*18. The Fresnel lens of claim 17, wherein each other draft angle of each other draft facet comprising an incomplete circumference in the fourth region is less than each other draft angle of each other draft facet comprising an incomplete circumference in the fifth region.*

*19. The Fresnel lens of claim 17, wherein each other draft angle of each other draft facet comprising an incomplete circumference in the fourth region is equal to each other draft angle of each other draft facet comprising an incomplete circumference in the fourth region and wherein each other draft angle of each other draft facet comprising an incomplete circumference in the fifth region is equal to each other draft angle of each other draft facet comprising an incomplete circumference in the fifth region.*

*20. A mold for making an array of Fresnel lenses, comprising:*

*an array of noncircular cavities, each cavity shaped to form a respective Fresnel lens, each cavity comprising:*

*a series of alternating slope facets and draft facets positioned in concentric circles within a periphery of the respective cavity;*

*wherein the draft facets of a first region of the mold have a first common draft angle common to all of the draft facets of the first region, the draft facets of a second region of the mold have a second common draft angle common to all of the draft facets of the second region, and the draft facets of a third region of the mold have a third common draft angle common to all of the draft facets of the third region, wherein the first common draft angle is constant within the first region, the second common draft angle is constant within the second region, and the third common draft angle is constant within the third region, and wherein the first common draft angle is smaller than the second common draft angle, and the third common draft angle is larger than the second common draft angle;*

*wherein a draft angle of each draft facet comprising a complete circumference within the periphery of the respective cavity is equal to each draft angle of each draft facet comprising a complete circumference within the periphery of the respective cavity; and*

*wherein another draft angle of each other draft facet comprising an incomplete circumference within the periphery of the respective cavity is different from each draft angle of each draft facet comprising a complete circumference within the periphery of the respective cavity.*

*21. The mold of claim 20, wherein each other draft angle of each other draft facet comprising an incomplete circumference within the periphery of the respective cavity is greater than each draft angle of each draft facet comprising a complete circumference within the periphery of the respective cavity.*

*22. The mold of claim 20, wherein each other draft angle of each other draft facet comprising an incomplete circumference within the periphery of the respective cavity increases with increasing distance from a geometric center of the Fresnel lens.*

*23. The mold of claim 20, wherein each other draft angle of each other draft facet comprising an incomplete circumference in a fourth region proximate to a geometric center of the respective cavity is different from each other draft angle*

*of each other draft facet comprising an incomplete circumference in a fifth region distal from a geometric center of the respective cavity.*

*24. The mold of claim 23, wherein each other draft angle of each other draft facet comprising an incomplete circumference in the fourth region is less than each other draft angle of each other draft facet comprising an incomplete circumference in the fifth region.*

*25. The mold of claim 23, wherein each other draft angle of each other draft facet comprising an incomplete circumference in the fourth region is equal to each other draft angle of each other draft facet comprising an incomplete circumference in the fourth region and wherein each other draft angle of each other draft facet comprising an incomplete circumference in the second region is equal to each other draft angle of each other draft facet comprising an incomplete circumference in the fifth region.*

*26. A method of making a Fresnel lens, comprising:*

*forming a series of alternating slope facets and draft facets positioned in concentric circles within a periphery of a noncircular substrate;*

*wherein forming the series of alternating slope facets and draft facets comprises forming the draft facets of a first region of the Fresnel lens to have a first common draft angle common to all of the draft facets of the first region, the draft facets of a second region of the Fresnel lens to have a second common draft angle common to all of the draft facets of the second region, and the draft facets of a third region of the Fresnel lens to have a third common draft angle common to all of the draft facets of the third region, wherein the first common draft angle is constant within the first region, the second common draft angle is constant within the second region, and the third common draft angle is constant within the third region, and wherein the first common draft angle is smaller than the second common draft angle, and the third common draft angle is larger than the second common draft angle;*

*orienting a draft angle of each draft facet comprising a complete circumference within the periphery of the substrate to be equal to each draft angle of each draft facet comprising a complete circumference within the periphery of the substrate; and*

*orienting another draft angle of each other draft facet comprising an incomplete circumference within the periphery of the substrate to be different from each draft angle of each draft facet comprising a complete circumference within the periphery of the substrate.*

*27. The method of claim 26, further comprising orienting each other draft angle of each other draft facet comprising an incomplete circumference within the periphery of the substrate to be greater than each draft angle of each draft facet comprising a complete circumference within the periphery of the substrate.*

*28. The method of claim 26, further comprising orienting each other draft angle of each other draft facet comprising an incomplete circumference within the periphery of the substrate to increase with increasing distance from a geometric center of the Fresnel lens.*

*29. The method of claim 26, further comprising orienting each other draft angle of each other draft facet comprising an incomplete circumference in a fourth region proximate to a geometric center of the substrate to be different from each other draft angle of each other draft facet comprising an incomplete circumference in a fifth region distal from a geometric center of the substrate.*

*30. The method of claim 29, further comprising orienting each other draft angle of each other draft facet comprising an incomplete circumference in the fourth region to be less than each other draft angle of each other draft facet comprising an incomplete circumference in the fifth region.*

* * * * *